(12) United States Patent
Saye (10) Patent No.: US 6,327,152 B1
(45) Date of Patent: Dec. 4, 2001

(54) INTERCHANGEABLE MODULAR ARRANGEMENT OF COMPUTER AND ACCESSORY DEVICES

(75) Inventor: Tony Pingfu Saye, Saratoga, CA (US)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 09/444,268

(22) Filed: Nov. 19, 1999

Related U.S. Application Data (63) Continuation of application No. 09/058,970, filed on Apr. 10, 1998, now Pat. No. 6,137,686.

(51) Int. Cl.[7] ................................................ H05K 5/02
(52) U.S. Cl. .................. 361/732; 361/683; 361/729; 361/731; 361/735; 455/347; 455/349; 455/351; 455/575; 429/98
(58) Field of Search .................. 361/730–733, 361/735, 729, 683–686; 439/928, 928.1; 340/572.8, 572.9; 429/97, 98, 100; 455/66, 90, 95, 128, 344, 346–349, 351, 575; 379/185, 325, 328–330, 428, 429, 433, 434, 440–442, 447, 450

(56) References Cited

U.S. PATENT DOCUMENTS

| | | | |
|---|---|---|---|
| 4,501,460 | 2/1985 | Sisler | 339/49 |
| 4,558,914 | 12/1985 | Prager et al. | 339/75 |
| 4,578,628 * | 3/1986 | Siwiak | 455/349 |
| 4,713,836 * | 12/1987 | Suzuki | 379/428 |
| 4,791,075 | 12/1988 | Lin | 438/612 |
| 5,216,278 | 6/1993 | Lin et al. | 257/737 |
| 5,251,329 * | 10/1993 | Takagi et al. | 455/349 |
| 5,253,141 | 10/1993 | Hellwig et al. | 361/729 |
| 5,306,576 | 4/1994 | Sasaki | 429/98 |
| 5,625,673 | 4/1997 | Grewe et al. | 455/90 |
| 5,664,012 * | 9/1997 | Chen | 379/433 |
| 5,677,830 | 10/1997 | Nogas et al. | 361/790 |
| 5,745,579 * | 4/1998 | Newman | 455/575 |
| 5,825,627 | 10/1998 | Tamura | 361/730 |
| 5,832,388 * | 11/1998 | Williams et al. | 455/575 |
| 5,841,836 * | 11/1998 | Dunn et al. | 379/441 |
| 5,854,984 * | 12/1998 | Buhrmann et al. | 455/575 |
| 5,864,467 | 1/1999 | Recchia et al. | 361/730 |
| 5,898,774 * | 4/1999 | Shindo | 379/433 |
| 5,999,821 * | 12/1999 | Kaschke | 455/575 |
| 6,027,828 * | 2/2000 | Hahn | 429/100 |
| 6,059,614 * | 5/2000 | Shelby et al. | 361/735 |

FOREIGN PATENT DOCUMENTS

| | | | |
|---|---|---|---|
| 63-52430 | 3/1988 | (JP) | 257/784 |

* cited by examiner

Primary Examiner—Jeffrey Gaffin
Assistant Examiner—John B. Vigushin
(74) Attorney, Agent, or Firm—Skjerven Morrill MacPherson LLP, Theodore P. Lopez (57) ABSTRACT

A structure wherein a hand held computer module can be conveniently and interchangeably coupled to accessory devices. The hand held computer module is detachably connected to a first accessory module by a first interlocking structure. The computer module includes the first interlock mechanism and the first accessory module includes the second interlock mechanism. The first and second interlock mechanisms are mated together to form a physical connection between the computer module and the first accessory module. The first accessory module also includes a third interlock mechanism which is similar to the first interlock mechanism. A second accessory module has a fourth interlock mechanism which is similar to the second interlock mechanism. The first accessory module can be detachably connected to a second accessory module by means of a second interlocking structure which includes the third and fourth interlock mechanisms. Alternatively, the third accessory module can be connected to the computer module using the first and fourth interlock mechanisms.

27 Claims, 11 Drawing Sheets

FIG. 10

INTERCHANGEABLE MODULAR ARRANGEMENT OF COMPUTER AND ACCESSORY DEVICES

This application is a continuation of Application Ser. No. 09/058,970, filed Apr. 10, 1998, now U.S. Pat. No. 6,137,686, which is herein incorporated by reference for all purposes.

FIELD OF THE INVENTION

The present invention relates to hand held or other miniature computers and accessory devices, such as battery packs and modems, and to techniques for interconnecting such devices.

BACKGROUND OF THE INVENTION

Hand held and other miniature computers are increasingly coming into use. Examples are the ROLODEX REX from Franklin Electronic and the PALM PILOT from 3Com, both of which are hand held personal digital assistants whose functionality includes a digital calendar, a "to do" list, and a phone list. "Computer" herein is used in its broadest sense to refer to any device capable of performing logic functions.

A drawback of hand held computers generally is the difficulty of expanding their functionality by the addition of hardware elements. For example, the ROLODEX REX can only download data by connecting into a PCMCIA type II slot, and hardware elements cannot be added to it to expand its functionality. Similarly, the PALM PILOT can only perform software and information downloads and uploads by connecting with a docking station.

Accordingly, there is a need for a technique by which the functionality of a hand held computer can be expanded quickly and easily by interconnecting the hand held computer to a variety of accessory devices, without destroying the hand held characteristic of the combination.

SUMMARY

The present invention advantageously provides a structure wherein a hand held computer module can be conveniently and interchangeably coupled to accessory devices. The hand held computer module is detachably connected to a first accessory module by means of a first interlocking structure. The first interlocking structure includes a first interlock mechanism on the computer module and a second interlock mechanism on the first accessory module, the first and second interlock mechanisms being mated together to form a physical connection between the computer module and the first accessory module. The first accessory module also includes a third interlock mechanism which is similar to the first interlock mechanism. A second accessory module has a fourth interlock mechanism which is similar to the second interlock mechanism. Accordingly, the first accessory module can be detachably connected to a second accessory module by means of a second interlocking structure which includes the third and fourth interlock mechanisms. Alternatively, the third accessory module can be connected to the computer module using the first and fourth interlock mechanisms.

The principles of this invention can be extended to an unlimited number of accessory modules, with each module having a pair of complementary interlock mechanisms such that it can be connected to the computer module or any other accessory module. The accessory modules may perform a wide variety of functions. Examples of devices that can be provided as accessory modules are modems, battery packs, cell phones, local area network (LAN) access devices, "one and a half way" pagers, two-way pagers, global positioning system devices, and personal area network (PAN) access devices.

In one embodiment the computer module and each accessory module is in the shape of a flat rectangular parallelepiped having two major opposing surfaces with similar lengths and widths. The complementary interlock mechanisms are positioned on the opposing surfaces of each module so that the modules can be stacked together in the manner of a deck of cards. To continue the analogy, since each module contains two interlock mechanisms, each of which is complementary to one of the interlock mechanisms on each of the other modules, the modules can be "shuffled" like a deck of cards, with any given module capable of being located on the top of the "deck" or at any position within the "deck". In some embodiments, the computer module will always be at one end of the stack and therefore will have an interlock mechanism on only one of its major surfaces.

Power and data are transferred between the modules by means of electrical contacts which are brought into contact when the modules are physically connected by means of the interlock mechanisms. Contact between the electrical contacts forms a bus linking the modules together electrically.

The combination of the hand held computer module and several accessory modules is relatively compact and can easily be carried by the user. Thus, embodiments of this invention provide the user of a hand held computer with a wide range of functionality while maintaining the advantages of small size and portability.

DETAILED DESCRIPTION

Figure 1:
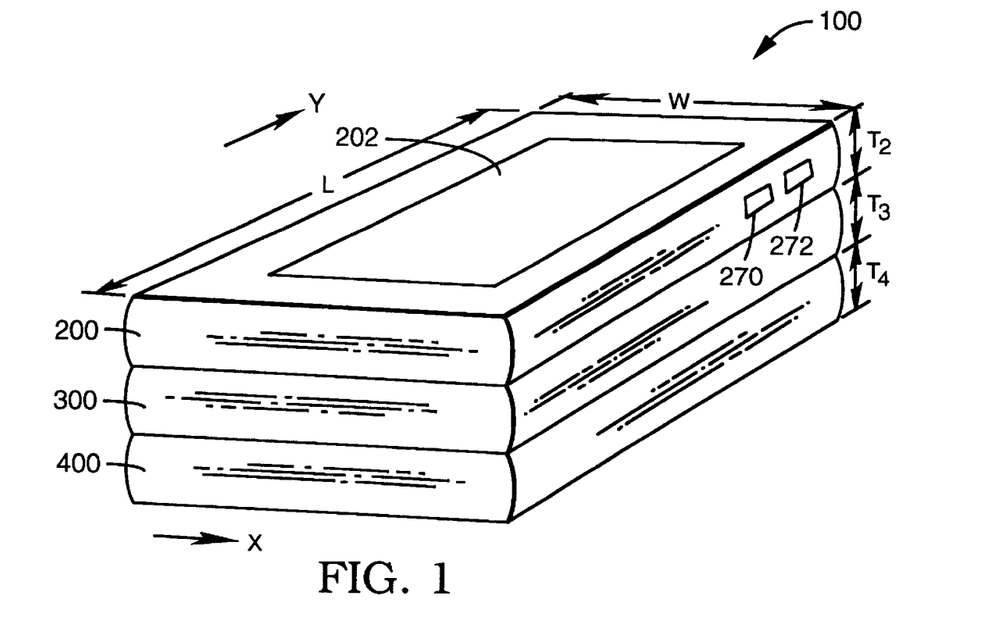
FIG. 1 depicts a perspective view of one embodiment of the invention showing a computer module coupled to a battery module and a modem module.

FIG. 1 depicts an arrangement 100 in accordance with the invention which includes a computer module 200, a battery module 300, and a modem module 400. Each of the modules 200, 300 and 400 is in the form of a flat, six-sided rectangular parallelepiped having a width W and a length L. Modules 200, 300 and 400 have thicknesses $T_2$, $T_3$ and $T_4$, respectively, which may be but are not necessarily equal. The total thickness of arrangement 100 ($T_2+T_3+T_4$) is small enough that arrangement can be conveniently held and manipulated by the user. In one embodiment, for example, the width W is 54 mm, the length L is approximately 86 mm and thicknesses $T_2$, $T_3$, and $T_4$ are approximately 10 mm each.

Display 202 can be, for example, a 320×240 dot liquid crystal display with a dot pitch of 0.18 mm which can display 4 gray scales. Buttons 270 and 272 on an edge panel of computer module 200 are used for entering simple commands such as on/off.

Figure 2:
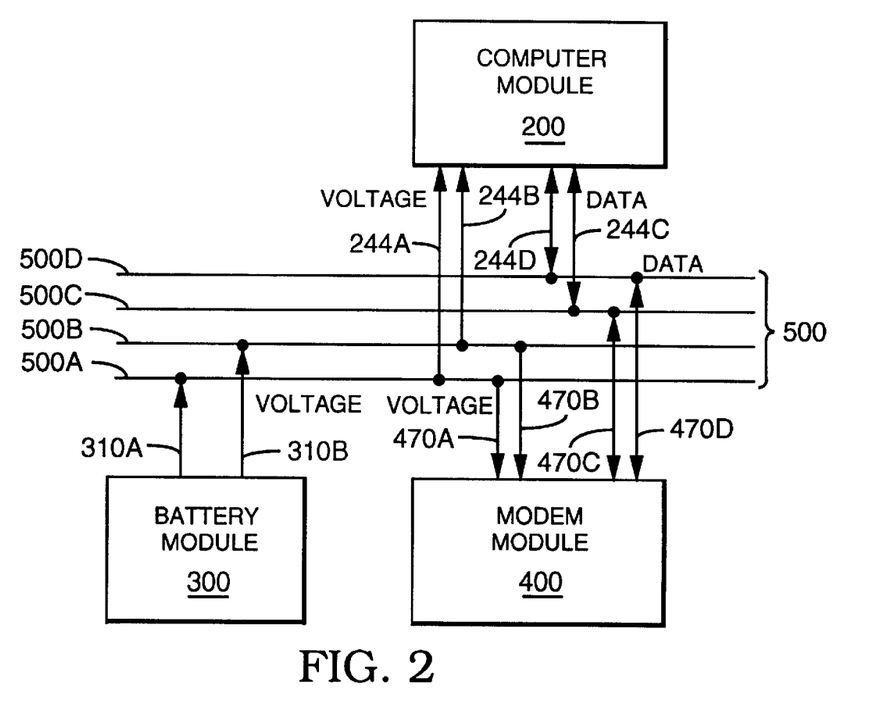
FIG. 2 depicts a block diagram showing schematically how the computer module, battery module, and modem module are connected together by means of a bus.

FIG. 2 depicts a block diagram showing computer module 200, battery module 300, and modem module 400 interconnected by a bus 500. In this embodiment bus 500 includes four leads 500A–500D. Leads 500A and 500B provide a supply voltage from battery module 300 to computer module 200 and modem module 400. Leads 500C and 500D, are dedicated to data communication between the modules using the Electronics Industry Association (EIA) RS 485 standard, described in Goldie, J., 10 Ways to Bulletproof RS-485 Interfaces, National Semiconductor Corporation, Santa Clara, Calif. (Aug. 1, 1996), which is incorporated herein by reference. As described further herein, other modules accessory to computer module 200 can be connected to bus 500 in addition to or in place of modules 300 and 400.

Figure 3A:
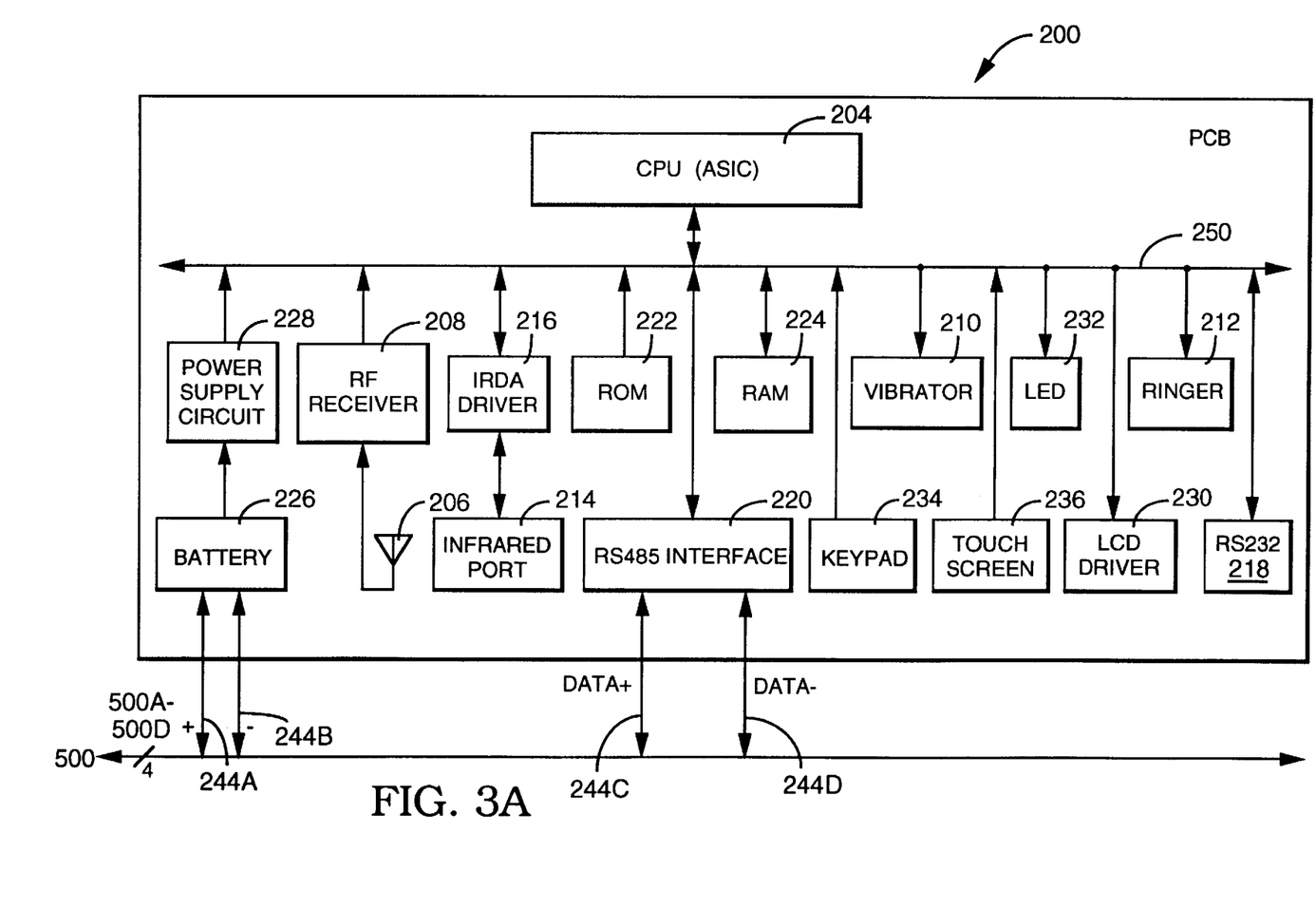
FIG. 3A depicts a block diagram showing the electrical structure of the computer module.

FIG. 3A provides a block diagram of computer module 200. Computer module 200 includes an application specific integrated circuit (ASIC) type central processing unit (CPU) 204. In this embodiment CPU 204 is a VR4111 available from NEC. CPU 204 uses a version of Microsoft CE as the operating system. CPU 204 communicates with accessory devices by means of an RS232 interface 218 and an RS485 interface 220. RS485 interface 220 provides and receives signals through connectors 244C and 244D, which connect to leads 500C and 500D, respectively, of bus 500.

Computer module 200 also includes a liquid crystal display (LCD) driver 230 for the display of information on display 202, depicted in FIG. 1. Display 202 is sensitive to touch through touch screen interface 236 so that displayed graphics or characters can be selected. A keypad 234 allows a user to enter simple commands through the buttons 270 and 272, shown in FIG. 1. An antenna 206, an RF receiver 208, a vibrator 210, light emitting diode (LED) 232, and a ringer 212 are provided for paging capabilities. RF receiver 208 includes FLEX (Motorola) protocol decoding functionality. Vibrator 210, LED 232, and ringer 212 provide notification of an incoming page. An infrared port 214 and an infrared data association (IrDA) driver 216 provide infrared communications capability between CPU 204 and accessory devices with infrared communications capability. A read-only memory (ROM) 222 and a random-access memory (RAM) 224 are provided for data storage. In this embodiment, 4 MB of ROM and 2 MB of RAM are provided. A battery 226, which may be charged by battery module 300, supplies power to computer module 200 through a power supply circuit 228. Battery 226 is a rechargeable lithium polymer battery. Battery 226 is coupled to connectors 244A and 244B to receive and provide supply voltage to the leads 500A and 500B of bus 500. Printed circuit board (PCB) 250 allows communication between components of computer module 200 and CPU 204 as well as supply of power to CPU 204.

Figure 3B:
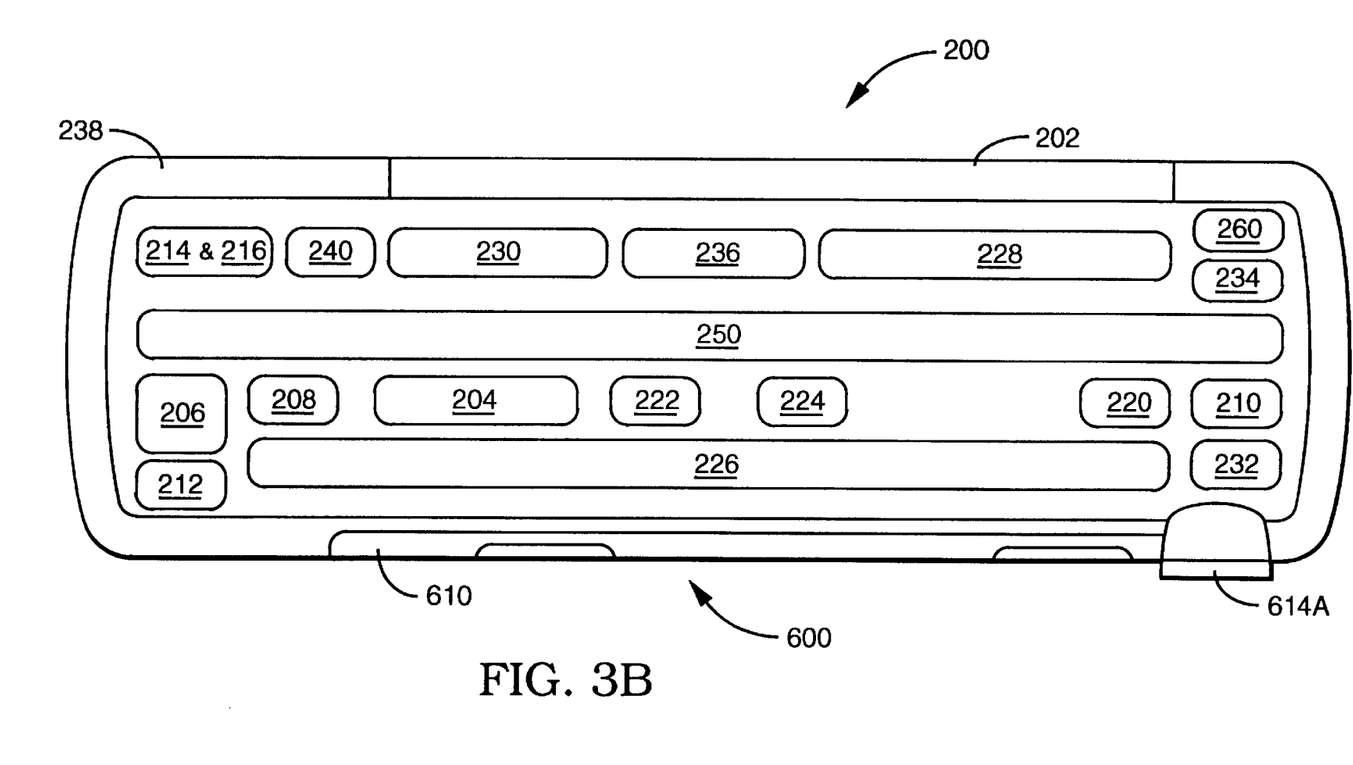
FIG. 3B depicts a cross-sectional view of the computer module showing the interlock mechanism and the physical location of the various components thereof.

FIG. 3B depicts a cut-away side view of computer module 200 showing the approximate physical locations of the components shown in FIG. 3A. Also shown in FIG. 3B are a vibrator 210, a ringer 212, a light-emiting diode (LED) 232, a speaker 240, and a microphone 260. An electrical contact 614A, which protrudes from computer module 200, forms a part of lead 500A. Electrical contact 614A is depicted as protruding from computer module 200 and rectangular in shape. Electrical contact 614A may alternatively protrude as an arch. Electrical contacts 614B–614D (shown in FIG. 6A) are similar to electrical contact 614A and form a part of leads 500B–500D, respectively. In this embodiment, electrical contacts 614A–614D are constructed of copper. The connections between the components of computer module 200 are generally made via PCB 250; for clarity, the connections between the components and PCB 250 are not shown in FIG. 3B.

In this embodiment, computer module 200 measures approximately 86 mm by 54 mm by 10 mm. Casing 238 of computer module 200 is metal or plastic and is at least thicker than the height of feet 702 (depicted in FIG. 7C). Casing 238 includes first slot 610, which is a part of interlock mechanism 600, described in more detail below with respect to FIGS. 6A–6D.

Computer module 200 is just one example of a computer module that could be employed in an arrangement according to this invention. Persons skilled in the art will be able to fabricate numerous other types of computer modules having similar or different functional characteristics as compared to computer module 200.

Figure 4A:
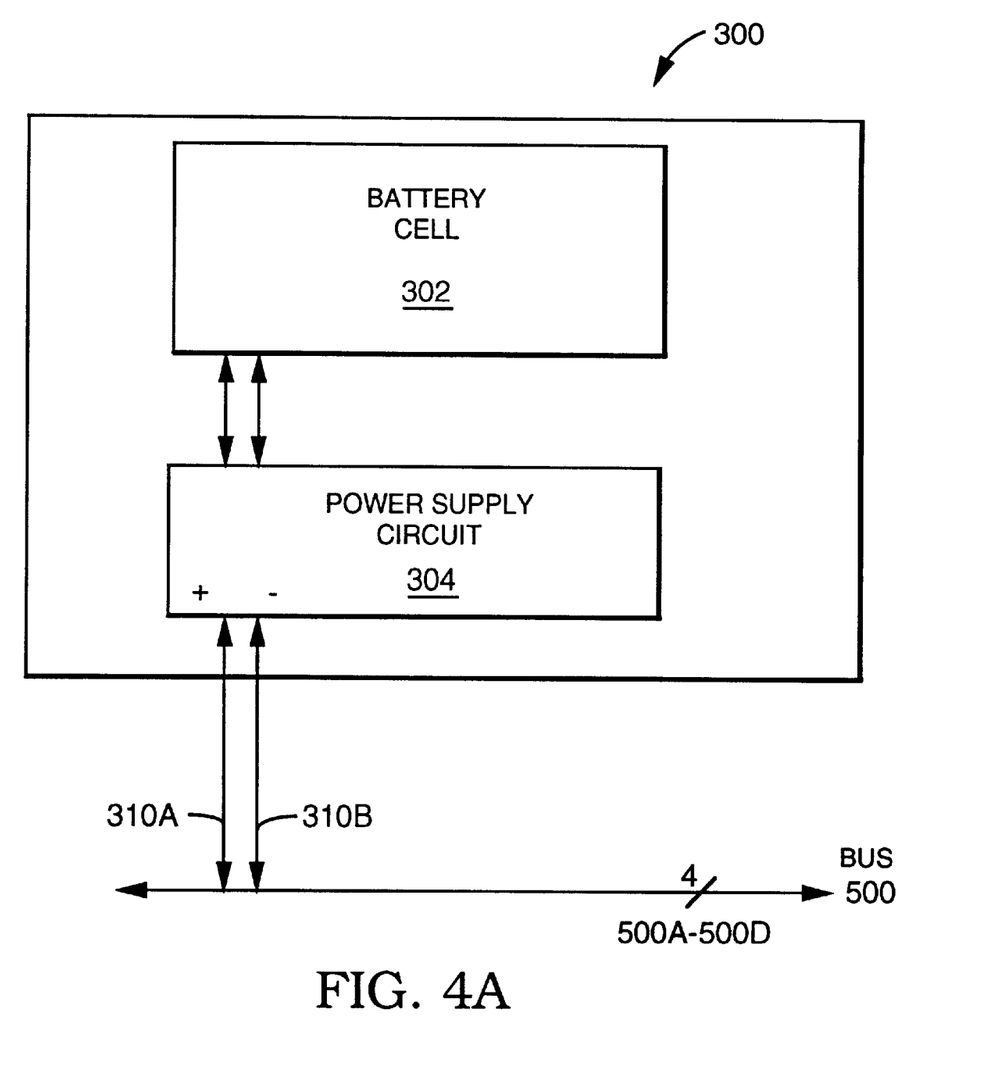
FIG. 4A depicts a block diagram showing the electrical structure of the battery module.

FIG. 4A depicts a block diagram of battery module 300. Battery module 300 includes battery cell 302 which is a rechargeable lithium polymer type and power supply circuit 304. The power supply circuit 304 regulates the power supplied between battery cell 302 and bus 500. Power supply circuit 304 supplies a voltage of 3.6 V above ground by connectors 310A and 310B to other modules such as computer module 200 and modem module 400 through leads 500A and 500B as depicted in FIG. 2. Construction of battery cell 302 is well known in the art.

Figure 4B:
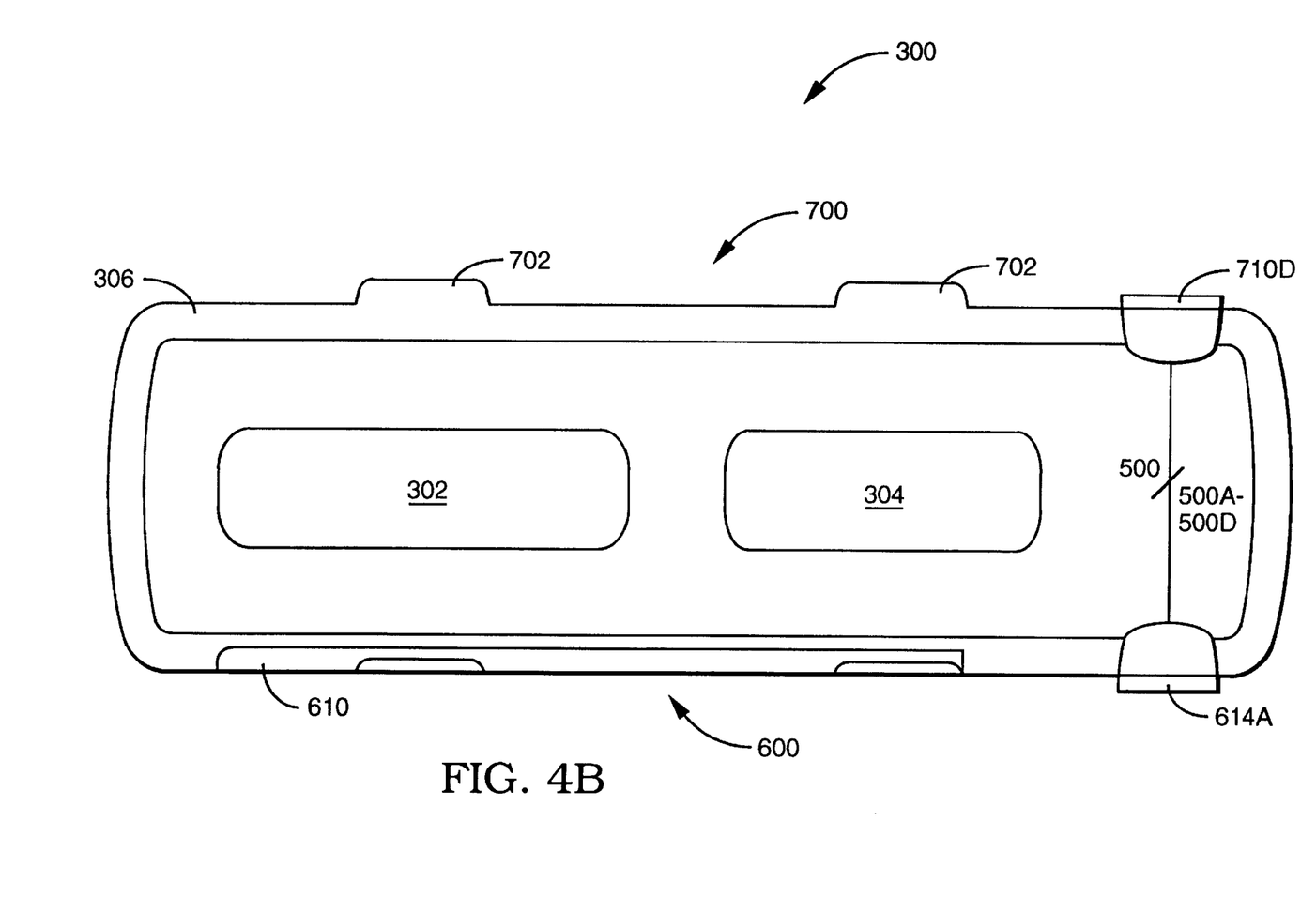
FIG. 4B depicts a cross-sectional view of the battery module showing both interlock mechanisms and the physical location of the various components thereof.

FIG. 4B depicts a cut-away side view of battery module 300 showing the approximate physical locations of the components of battery module 300 including battery cell 302, power supply circuit 304, casing 306, and electrical contacts 614A and 710D. Electrical contacts 710D and 614A, which protrude from battery module 300, form part of leads 500D and 500A, respectively. Electrical contacts 710A–710C (shown in FIG. 7A) are similar to electrical contact 710D and form part of leads 500A–500C and electrical contacts 614B–614D (shown in FIG. 6A) are similar to electrical contact 614A and form part of leads 500B–500D, respectively. Electrical contacts 710D and 614A are depicted as rectangular in shape but may alternatively protrude as arches. In this embodiment, electrical contacts 614A–614D and electrical contacts 710A–710D are constructed of copper.

Also shown in FIG. 4B are interlock mechanisms 600 and 700, described further below in connection with FIGS. 6A–6D and 7A–7C.

In this embodiment, battery module 300 measures approximately 86 mm by 54 mm by 10 mm. Casing 306 of battery module 300 is metal or plastic and is at least thicker than the height of feet 702, which are part of second interlock mechanism 700. Casing 306 includes first slot 610, which is a part of first interlock mechanism 600.

Figure 5A:
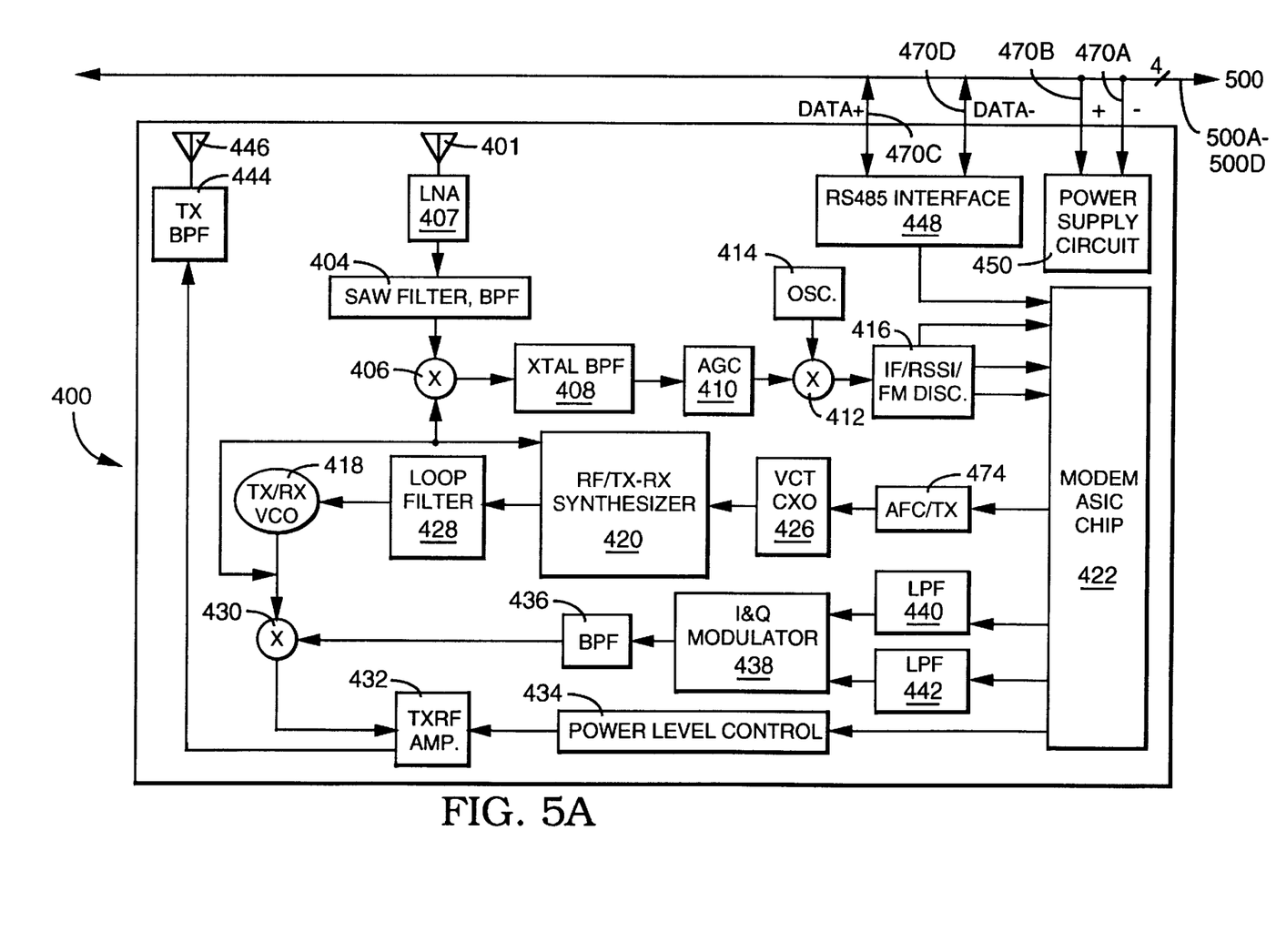
FIG. 5A depicts a block diagram showing the electrical structure of the modem module.

FIG. 5A depicts a block diagram of modem module 400. Modem module 400 includes circuitry for demodulating received information signals and providing the decoded information signals to the modem ASIC chip 422 (receiver circuitry 480), made by Rockwell. Receiver circuitry 480 includes receiver antenna 401, low noise amplifier (LNA) 402, saw filter/ band pass filter (BPF) 404, mixer 406, transmitter/receiver (Tx/Rx) voltage controlled oscillator (VCO) 418, crystal band pass filter 408, automatic gain control 410, mixer 412, oscillator 414, and IF/RSSI/FM disc 416. The circuitry for demodulating uses commonly available components well known to those of skill in the art.

Modem module 400 is further capable of transmitting information signals to external devices through transmitter circuitry 490. Information signals are modulated onto a carrier signal and transmitted through transmitter antenna 446. Transmitter circuitry 490 includes AFC transmitter (Tx) 424, VCT CXO 426, radio frequency transmitter-receiver (Tx-Rx) synthesizer 420, loop filter 428, low pass filters 440 and 442, I&Q modulator 438, band pass filter 436, power level control 434, transmitter radio frequency (Tx RF) amplifier 432, mixer 430, transmitter band pass filter 444, and transmitter antenna 446.

Power supply circuit 450 receives a supply voltage through connectors 470A and 470B. ASIC chip 422 can communicate with computer module 200 or other modules through connectors 470C and 470D by use of RS485 interface 448.

Figure 5B:
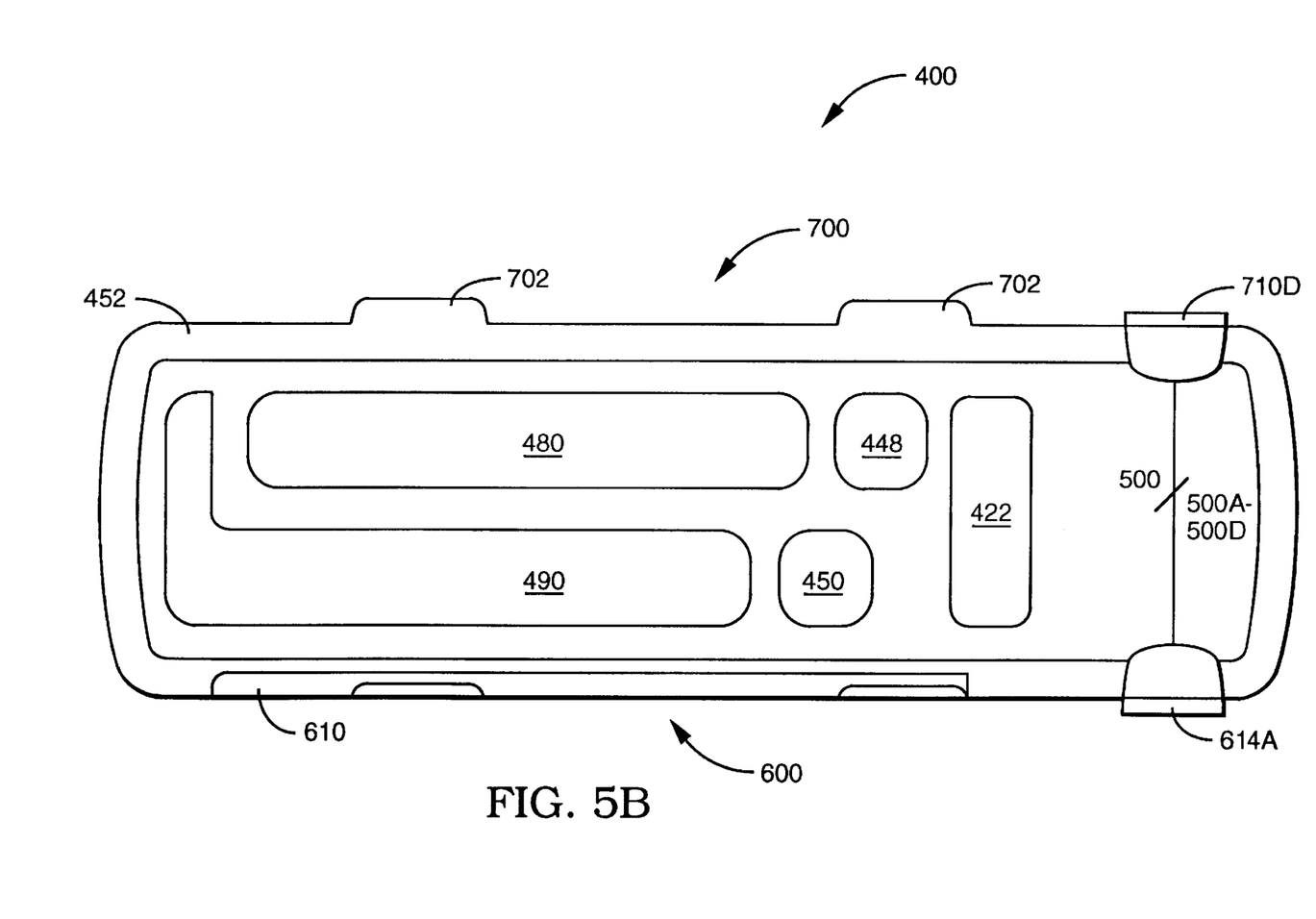
FIG. 5B depicts a cross-sectional view of the modem module showing both interlock mechanisms and the physical, location of the various components thereof.

FIG. 5B depicts a cut-away side view of modem module 400 depicting the approximate physical locations of the components of FIG. 5A as well as casing 452, and electrical contacts 710D and 614A. Electrical contacts 710D and 614A, which protrude from modem module 400, form part of leads 500D and 500A, respectively. Electrical contacts 710A–710C (shown in FIG. 7A) and similar to electrical contact 710D and form part of leads 500A–500C; electrical contacts 614B–614D (shown in FIG. 6A) are similar to electrical contacts 614A and form part of leads 500B–500D. Connectors 470A and 470B ensure voltage signals are passed between power supply circuit 450 and leads 500A and 500B, respectively. Connectors 470C and 470D ensure data signals are passed between RS485 interface 448 and leads 500C and 500D, respectively. Electrical contacts 710D and 614A are depicted as rectangular in shape but may alternatively protrude as arches. In this embodiment, electrical contacts 614A–614D and electrical contacts 710A–710D are constructed of copper.

In this embodiment, modem module 400 measures approximately 86 mm by 54 mm by 10 mm. Casing 452 of modem module 400 is metal or plastic and is at least thicker than the height of feet 702, which are part of second interlock mechanism 700. Casing 452 includes first slot 610, which is a part of first interlock mechanism 600.

FIGS. 6A–6D illustrate different views of a first interlock mechanism 600 which is located on one of the major surfaces of battery module 300 and modem module 400. FIGS. 7A–7C illustrate different views of a second interlock mechanism 700 which is located on one of the major surfaces of computer module 200, battery module 300 and modem module 400.

Figures 6A, 6D:
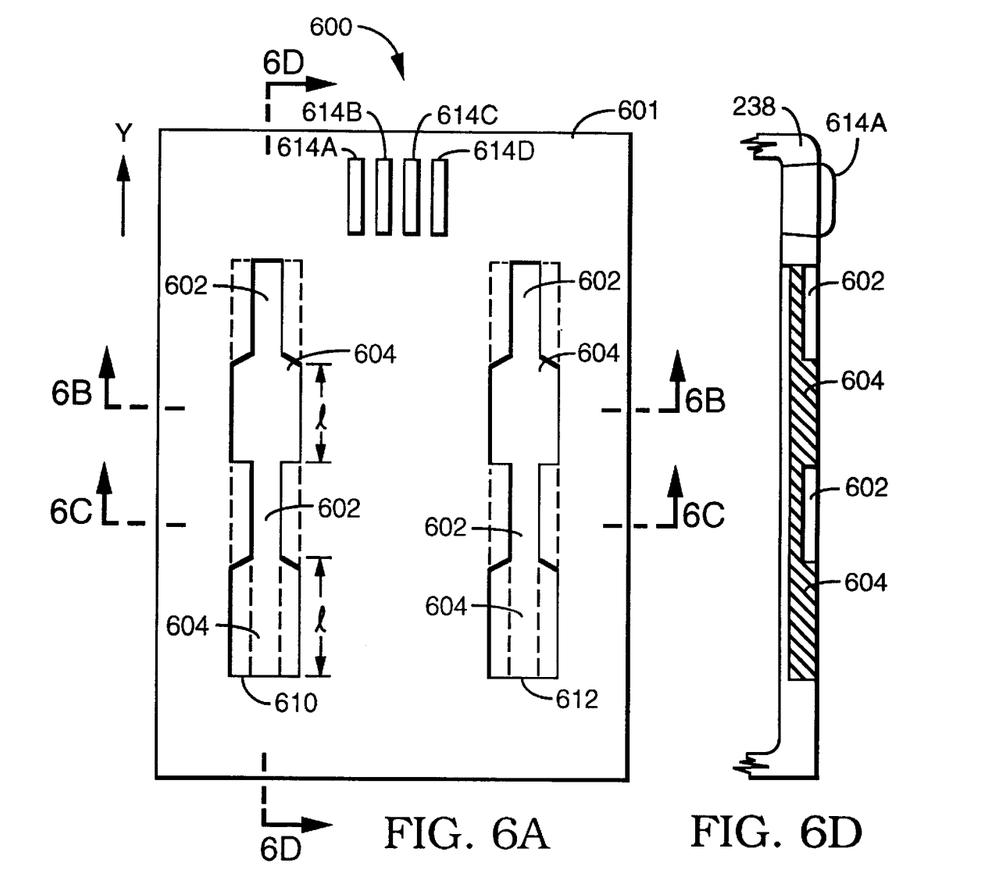
FIG. 6A depicts a plan view of a major surface of one of the modules, showing the first interlock mechanism and the electrical contacts used to form a bus.
FIG. 6D depicts a portion of a cross-sectional view of the first interlock mechanism taken at section line 6D—6D in FIG. 6A.
Figure 6B:
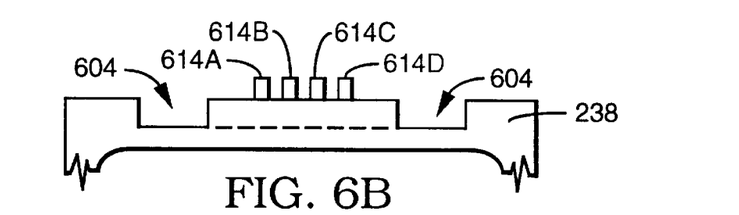
FIG. 6B depicts a portion of a cross-sectional view of the first interlock mechanism taken along section line 6B—6B in FIG. 6A.
Figure 6C:
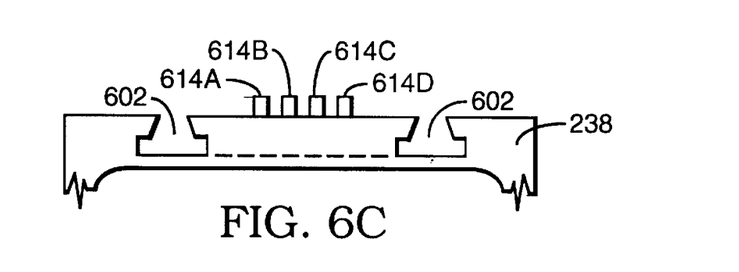
FIG. 6C depicts a portion of a cross-sectional view of the first interlock mechanism taken along section line 6C—6C in FIG. 6A.
Figure 7A:
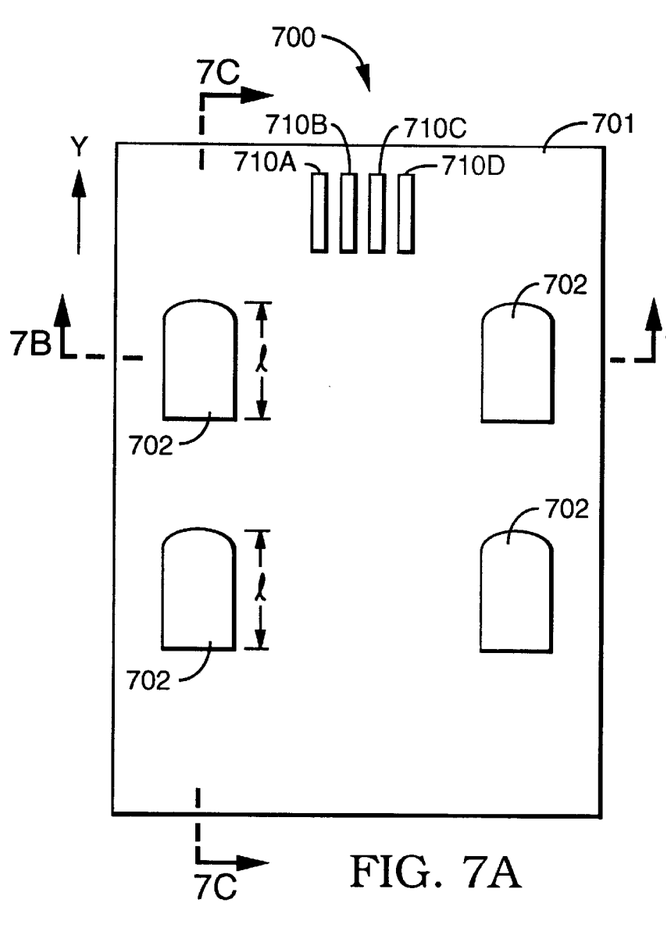
FIG. 7A depicts a plan view of the other major surface of one the modules, showing the second interlock mechanism, complementary to the first interlock mechanism, and the electrical contacts used to form a bus.
Figure 7B:
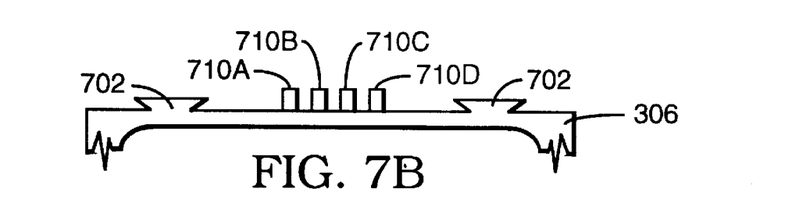
FIG. 7B depicts a portion of a cross-sectional view of the second interlock mechanism taken at section line 7B—7B in FIG. 7A.
Figure 7C:
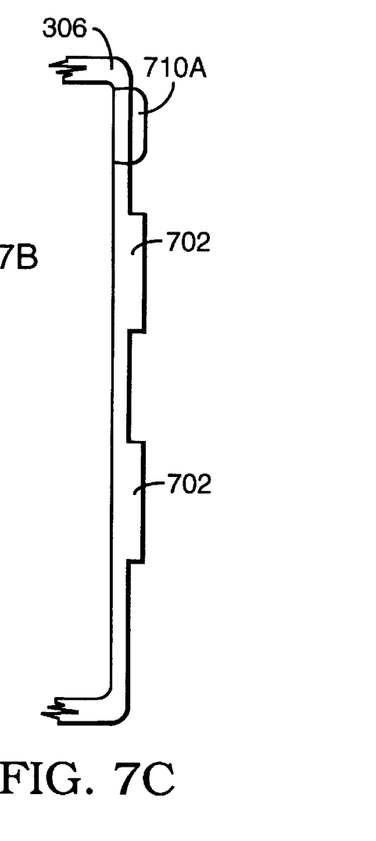
FIG. 7C depicts a portion of a cross-sectional view of the second interlock mechanism taken at section line 7C—7C in FIG. 7A.

Referring first to FIGS. 6A–6D, FIG. 6A shows a plan view of the first interlock mechanism 600 on a major surface 601. Interlock mechanism 600 includes a first slot 610 and a second slot 612, which are identical. Each of slots 610 and 612 includes two wide sections 604 and two narrow sections 602. As shown in FIG. 6B, taken at cross-section 6B—6B in FIG. 6A, each of wide sections 604 has a simple rectangular shape. As shown in FIG. 6C, taken at cross-section 6C—6C in FIG. 6A, each of narrow sections 608 has a shape which conforms to the shape of one of feet 702 shown in FIGS. 7A–7C. FIG. 6D is a cross-sectional view taken at section 6D—6D in FIG. 6A. Also shown in FIGS. 6A–6C are electrical contacts 614A—614D.

FIG. 7A shows a plan view of the second interlock mechanism 700 on a major surface 701, showing the feet 702. Feet 702 may be constructed of metal or plastic and may be affixed to or part of major surface 701. FIG. 7B shows a cross-sectional view of two of the feet 702 taken at section 7B—7B in FIG. 7A, and FIG. 7C shows a cross-sectional view taken at section 7C—7C in FIG. 7A. Also shown in FIGS. 7A and 7B are electrical contacts 710A–710D.

As is evident from FIGS. 6A and 7A, the relative positions of wide sections 604 on major surface 601 correspond to the relative positions of feet 702 on major surface 701. Each of wide sections 604 has a length 1 which is slightly larger than the length of feet 702. Thus, when major surfaces 601 and 701 are brought face-to-face, feet 702 fit into wide sections 604. When second interlock mechanism 700 is moved upward with respect to first interlock mechanism 600 (see the Y arrow in FIG. 6A), feet 702 slide into the narrow sections 602, thereby locking interlock mechanisms 600 and 700 together. Since the positions of electrical contacts 614A–614D on major surface 601 correspond to the respective positions of electrical contacts 710A–710D on major surface 701, when the mechanisms 600 and 700 are interlocked, electrical contacts 614A–614D make electrical contact with electrical contacts 710A–710D, respectively.

When two or more modules are interlocked, the electrical contacts of each adjacent pair of modules are in contact. The electrical contacts in each module, together with the internal connections between the contacts inside the modules, represented for example by the internal connection between contacts 614A and 710D in FIGS. 4B and 5B, form the bus 500. Bus 500 is thus extended to include as many modules as are interlocked together. The components within each modules obtain power or data as necessary from the appropriate leads within the bus 500 (leads 500A and 500B for power, leads 500C and 500D for data).

Interlock mechanisms 600 and 700 are "complementary", in the sense that each of them contains surfaces which mate with corresponding surfaces on the other such that the major surfaces 601 and 701 are detachably linked together when the mechanisms 600 and 700 are locked.

Figure 8:
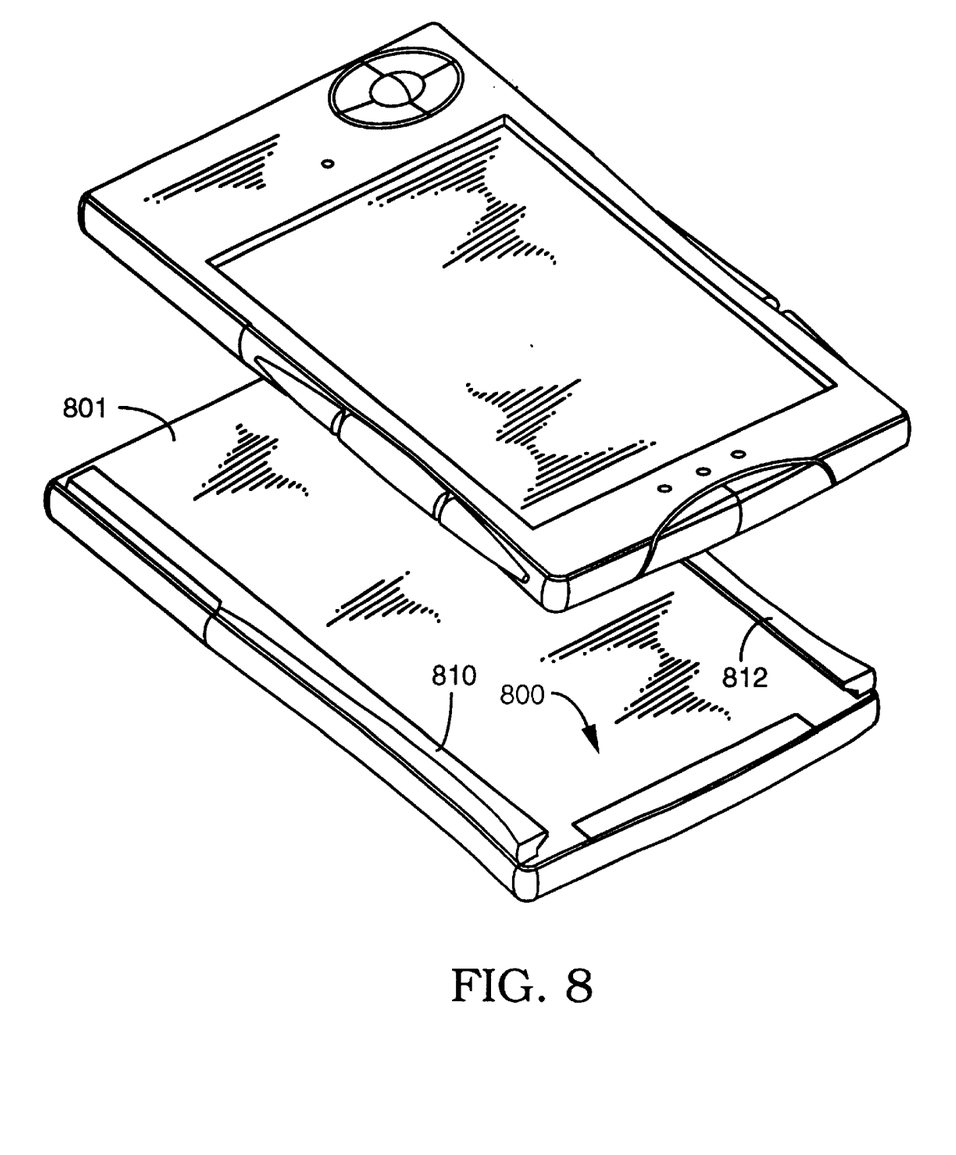
FIG. 8 depicts an alternative embodiment of an interlock mechanism.
Figure 9:
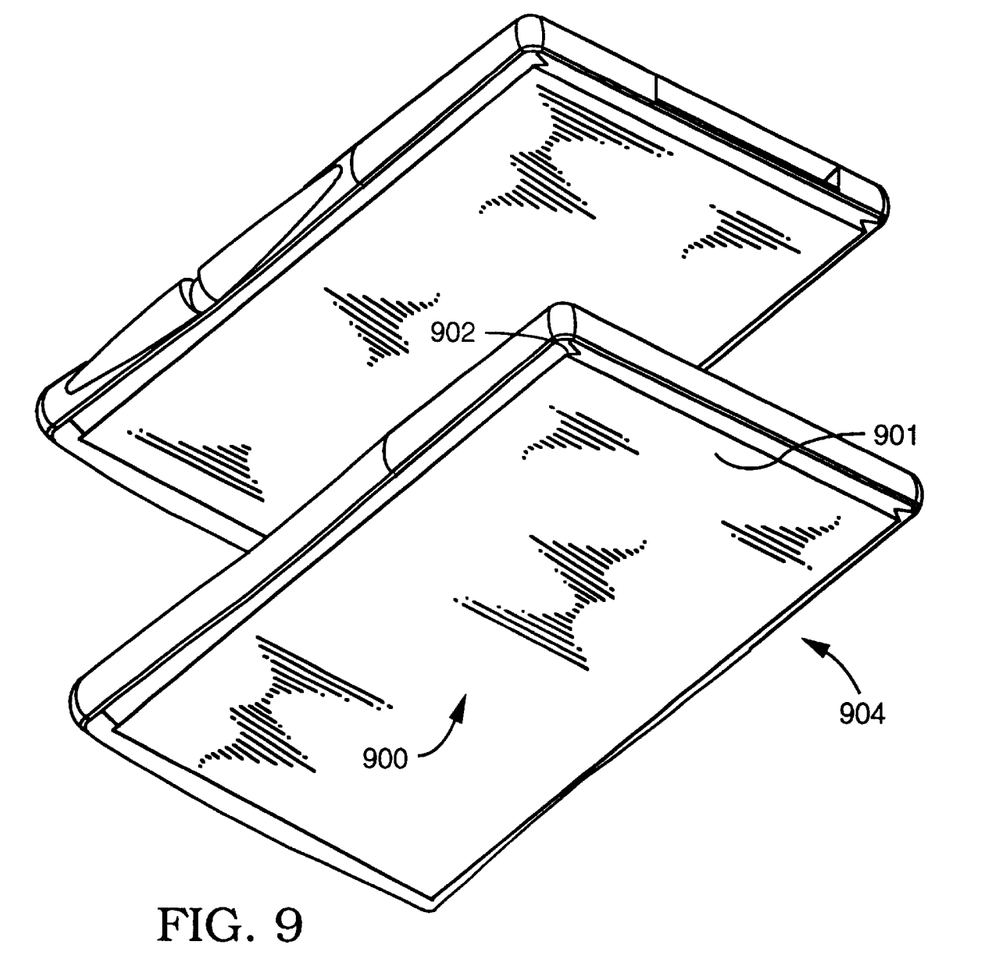
FIG. 9 depicts an interlock mechanism that can be used with the interlock mechanism of FIG. 8.
Figure 10:
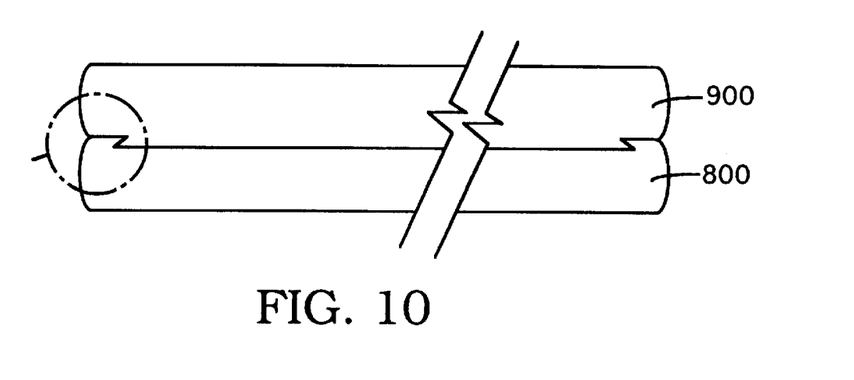
FIG. 10 depicts a cross-sectional view showing the interlock mechanisms of FIGS. 8 and 9 mated together.

It will be apparent to those skilled in the art that there are a wide variety of mechanisms that could be used to detachably connect the modules together. For example, the shapes of the feet and slots may be varied. Alternatively, a system of interlocking rails and grooves as shown in FIGS. 8 and 9 could be used. Interlock mechanism 800 includes rails 810 and 812 which extend from major surface 801, and interlock mechanism 900 includes grooves 902 and 904 which are formed on the edges of major surface 901. Rails 810 and 812 mate with grooves 902 and 904 providing a secure contact between the modules. Interlock mechanisms 800 and 900 are shown connected in the cross-sectional view of FIG. 10. Snap-type fittings can also be used. The bonding between modules can also be magnetic.

Moreover, many of the modules contain both first and second interlock mechanisms, allowing such modules to be positioned at any location in the stack of modules. Certain modules, however, may contain only one of the interlock mechanisms, and such modules can be positioned only at an end of the stack. In the embodiment described above, for example, computer module 200 contains only a first interlock mechanism 600, while battery module 300 and modem module 400 each contain both a first interlock mechanism 600 and a second interlock mechanism 700. In alternative embodiments, the computer module could contain both the first and second interlock mechanisms.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An arrangement of interconnected modules comprising:
   a portable hand held computer module having a first side and a second side, said second side including a first electrical contact; and
   a portable hand held communication module having a first side and a second side, said communication module being detachably coupled to said computer module by a first interlocking structure, said first interlocking structure including a first interlock mechanism on said second side of said computer module and a second interlock mechanism on said first side of said communication module, said first and second interlock mechanisms mating with each other to form a physical connection between said computer module and said communication module, said communication module further including a third interlock mechanism, said third interlock mechanism being similar to said first interlock mechanism,
   said communication module being capable of receiving and transmitting information signals to and from said arrangement of modules, said information signals capable of being operated on by said computer module, said first side of said communication module including a second electrical contact, said first and second electrical contacts coupling by a movement of said second side of said computer module parallel to said first side of said communication module.

2. The arrangement of claim 1, wherein said communication module comprises a second electrical contact, said first and said second electrical contacts being in contact.

3. The arrangement of claim 1, further comprising a portable hand held first accessory module detachably connected to said communication module by a second interlocking structure, said second interlocking structure comprising said third interlock mechanism and a fourth interlock mechanism on said first accessory module, said third and fourth interlock mechanisms mating with each other to form a physical connection between said communication module and said first accessory module, said fourth interlock mechanism being similar to said second interlock mechanism, said first accessory module being selected from the group consisting of a battery module, a cell phone, a local area network access device, a personal area network device, a pager, and a global positioning device.

4. The arrangement of claim 3, wherein said communication module and said first accessory module are similar in length and width to said computer module.

5. The arrangement of claim 3, wherein said communication module includes a third electrical contact and said first accessory module includes a fourth electrical contact, wherein said third electrical contact and said fourth electrical contact are coupled when said third and fourth interlock mechanisms mate.

6. The structure of claim 3, wherein the structure of interconnected modules has a total dimension of approximately 30 mm by 86 mm by 54 mm.

7. The arrangement of claim 3, wherein said communication module comprises a second electrical contact on said first side and a third electrical contact on said second side, said second and third electrical contacts being permanently connected together via a first conduction path; and said first accessory module comprises a fourth electrical contact, said first and second electrical contacts being detachably in contact with each other and said third and fourth electrical contacts being detachably in contact with each other such that said first, second, third, and fourth contacts and said first conduction path together form a bus.

8. The arrangement of claim 7, wherein one of said communication module and first accessory module comprises a battery module and said bus is for carrying power from said battery module to said computer module.

9. The arrangement of claim 8, wherein said bus is for carrying power from said battery module to the other of said communication module and said first accessory module.

10. The arrangement of claim 1, wherein said first interlock mechanism comprises a slot.

11. The arrangement of claim 10, wherein said second interlock mechanism comprises a foot.

12. The arrangement of claim 1, wherein a length of said computer module is approximately 86 mm and a width of said computer module is approximately 54 mm.

13. The arrangement of claim 1, wherein said computer module comprises a display.

14. The arrangement of claim 1, wherein said first interlock mechanism and said second interlock mechanism comprise a snap-type fitting.

15. The arrangement of claim 1, wherein said first interlock mechanism and said second interlock mechanism comprise magnets.

16. The arrangement of claim 1, wherein said communication module comprises receiver circuitry and transmitter circuitry.

17. An arrangement of interconnected modules comprising:
   a portable hand held computer module having a first side and a second side, said second side including a first electrical contact;

a portable hand held communication module having a first side and a second side, said communication module being detachably coupled to said computer module by a first interlocking structure, said first interlocking structure including a first interlock mechanism on said second side of said computer module and a second interlock mechanism on said first side of said communication module, said first and second interlock mechanisms mating with each other to form a physical connection between said computer module and said communication module, said communication module further including a third interlock mechanism, said third interlock mechanism being similar to said first interlock mechanism, said communication module being capable of receiving and transmitting information signals to and from said arrangement of modules, said information signals capable of being operated on by said computer module; and a portable hand held first accessory module detachably connected to said communication module by a second interlocking structure, said second interlocking structure comprising said third interlock mechanism and a fourth interlock mechanism on said first accessory module, said third and fourth interlock mechanisms mating with each other to form a physical connection between said communication module and said first accessory module, said fourth interlock mechanism being similar to said second interlock mechanism, said first accessory module being selected from the group consisting of a battery module, a cell phone, a local area network access device, a personal area network device, a pager, and a global positioning device, said fourth interlock mechanism including a rail and said third interlock mechanism including a groove, said groove is inserted under said rail and is secured under said rail.

18. An arrangement of interconnected modules comprising:

a portable hand held computer module having a first side and a second side, said second side including a first electrical contact; and a portable hand held first accessory module having a first side and a second side, said first accessory module being detachably coupled to said computer module by a first interlocking structure, said first interlocking structure including a first interlock mechanism on said second side of said computer module and a second interlock mechanism on said first side of said first accessory module, said first and second interlock mechanisms mating with each other to form a physical connection between said computer module and said first accessory module, said first accessory module further including a third interlock mechanism, said third interlock mechanism being similar to said first interlock mechanism, said first accessory module being selected from the group consisting of a battery module, a cell phone, a local area network access device, personal area network device, a pager, and a global positioning device, said first interlock mechanism comprising a slot, said second interlock mechanism comprising a foot, wherein said slot includes a narrow section and a wide section, said foot is T-shaped and a top of said foot is wider than said narrow section and narrower than said wide section.

19. The arrangement of claim 18 wherein said foot is inserted into said wide section and is secured under said narrow section.

20. An arrangement of interconnected modules comprising:

a portable hand held computer module having a first side and a second side, said second side including a first electrical contact; and a portable hand held communication module having a first side and a second side, said communication module being detachably coupled to said computer module by a first interlocking structure, said first interlocking structure including a first interlock mechanism on said second side of said computer module and a second interlock mechanism on said first side of said communication module, said first and second interlock mechanisms mating with each other to form a physical connection between said computer module and said communication module, said communication module further including a third interlock mechanism, said third interlock mechanism being similar to said first interlock mechanism, said communication module being capable of receiving and transmitting information signals to and from said arrangement of modules, said information signals capable of being operated on by said computer module, said first interlock mechanism comprises a groove.

21. The arrangement of claim 20 wherein said second interlock mechanism comprises a rail.

22. The arrangement of claim 21 wherein said groove is inserted under said rail and is secured under said rail.

23. An arrangement of interconnected modules comprising:

a portable hand held computer module having a first side and a second side, said second side including a first electrical contact; and a portable hand held first accessory module having a first side and a second side, said first accessory module being detachably coupled to said computer module by a first interlocking structure, said first interlocking structure including a first interlock mechanism on said second side of said computer module and a second interlock mechanism on said first side of said first accessory module, said first and second interlock mechanisms mating with each other to form a physical connection between said computer module and said first accessory module, said first accessory module further including a third interlock mechanism, said third interlock mechanism being similar to said first interlock mechanism, said first accessory module being selected from the group consisting of a battery module, a cell phone, a local area network access device, personal area network device, a pager, and a global positioning device, wherein said first side of said first accessory module includes a second electrical contact, said first and second electrical contacts coupling by a movement of said second side of said computer module parallel to said first side of said first accessory module.

24. A structure of interconnected modules comprising:

a hand held computer module;

a first hand held accessory module; and a second hand held accessory module, said computer module, said first accessory module, and said second accessory module being coupled to allow a voltage supply and data signals to be passed between each module, said structure of interconnected modules being hand held, said first accessory module being capable of receiving and transmitting said data signals to an external device, and said computer module being capable of performing an operation on said information signal, wherein the computer module comprises conducting portions on at least one side and wherein said first accessory module and said second accessory module further comprise conducting portions on at least two sides, wherein said computer module comprises slots on at least one side, wherein said first accessory module and said second accessory module comprise feet on at least one side and slots on an opposite side of each of said first and said second accessory modules, said feet for attaching to slots of other accessory modules, and for attaching to said slots on said at least one side of said computer module, wherein the feet of the first accessory module are fastenable to the slots of the computer module to allow a signal to pass between the conducting portion of the computer module and the conducting portion of the first accessory module, and wherein the feet of the second accessory module are fastenable to the slots of the first accessory module to allow a signal to pass between the conducting portion of the first accessory module and the conducting portion of the second accessory module, wherein the slots include a narrow section and a wide section wherein the feet are T-shaped and the top of the feet is wider than the narrow section and narrower than the wide section.

25. The structure of claim 24 wherein the feet insert into the wide sections and are secured under the narrow sections so that the computer, first, and second modules establish the secure connection.

26. A structure of interconnected modules comprising:

a hand held computer module;

a first hand held accessory module; and a second hand held accessory module, said computer module, said first accessory module, and said second accessory module being coupled to allow a signal to be passed between each module, said structure of interconnected modules being hand held, wherein the computer module comprises signal conducting portions on at least one side and wherein said first accessory module and said second accessory module further comprise signal conducting portions on at least two sides, wherein said computer module comprises slots on at least one side, wherein said first accessory module and said second accessory module comprise feet on at least one side and slots on an opposite side of each of said first and said second accessory modules, said feet for attaching to slots of other accessory modules, and for attaching to said slots on said at least one side of said computer module, wherein the feet of the first accessory module are fastenable to the slots of the computer module to allow a signal to pass between the signal conducting portion of the computer module and the signal conducting portion of the first accessory module, and wherein the feet of the second accessory module are fastenable to the slots of the first accessory module to allow a signal to pass between the signal conducting portion of the first accessory module and the signal conducting portion of the second accessory module, wherein the slots include a narrow section and a wide section wherein the feet are T-shaped and the top of the feet is wider than the narrow section and narrower than the wide section.

27. The structure of claim 26, wherein the feet insert into the wide sections and are secured under the narrow sections so that the computer, first, and second modules establish the secure connection.

\* \* \* \* \*